US007560224B2

(12) United States Patent
Sato et al.

(10) Patent No.: US 7,560,224 B2
(45) Date of Patent: Jul. 14, 2009

(54) METHOD OF MANUFACTURING LIQUID DISCHARGE HEAD, AND LIQUID DISCHARGE HEAD

(75) Inventors: Tamaki Sato, Kawasaki (JP); Ryoji Kanri, Zushi (JP); Masataka Kato, Naka-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 446 days.

(21) Appl. No.: 11/280,310

(22) Filed: Nov. 17, 2005

(65) Prior Publication Data

US 2006/0109315 A1 May 25, 2006

(30) Foreign Application Priority Data

Nov. 22, 2004 (JP) ............................. 2004-337301

(51) Int. Cl.
*G03F 7/00* (2006.01)

(52) U.S. Cl. ......................... 430/320; 430/30; 430/323; 430/22; 216/27

(58) Field of Classification Search ................. 430/320, 430/30, 323, 22
See application file for complete search history.

(56) References Cited

U.S. PATENT DOCUMENTS 5,278,584 A 1/1994 Keefe et al.
5,331,344 A 7/1994 Miyagawa et al.
5,478,606 A * 12/1995 Ohkuma et al. ............. 427/555
6,880,916 B2 4/2005 Kim
6,953,530 B2 10/2005 Kanri
7,101,440 B2 9/2006 Nakamura et al.
7,117,597 B2 * 10/2006 Nishida ..................... 29/890.1
2002/0119248 A1 * 8/2002 Suzuki .................... 427/248.1
2003/0048328 A1 * 3/2003 Inamoto et al. ............... 347/44
2003/0151637 A1 8/2003 Nakamura et al.
2005/0255666 A1 * 11/2005 Yang .......................... 438/401
2006/0250077 A1 11/2006 Nakamura et al.
2006/0250445 A1 11/2006 Nakamura et al.
2006/0251804 A1 11/2006 Nakamura et al.

FOREIGN PATENT DOCUMENTS

CN 1108928 5/2003
KR 2003-0096720 A 12/2003
TW 559594 B 11/2003

* cited by examiner

*Primary Examiner*—Mark F Huff
*Assistant Examiner*—Caleen O Sullivan
(74) *Attorney, Agent, or Firm*—Fitzpatrick, Cella, Harper & Scinto

(57) ABSTRACT

According to the present invention, there are provided an ink jet recording head capable of performing high-precision printing and recording and having a high reliability, and a method of manufacturing the head. The ink jet recording head of the present invention has: an element substrate on whose surface an ink discharge energy generating element is formed and which is made of silicon; and a thin and flat inorganic substrate in which an ink discharge port is formed in a portion disposed vertically above the ink discharge energy generating element. Furthermore, the head includes a photosensitive material layer which bonds the element substrate to the inorganic substrate and which is to constitute a wall forming an ink flow path which communicates with the ink discharge port. The inorganic substrate is laminated on the element substrate provided with the photosensitive material layer, and is thereafter provided with the ink discharge port.

8 Claims, 7 Drawing Sheets

METHOD OF MANUFACTURING LIQUID DISCHARGE HEAD, AND LIQUID DISCHARGE HEAD

BACKGROUND OF THE INVENTION

1. Field of the Invention

The present invention relates to a method of manufacturing a liquid discharge head which discharges a liquid, and a liquid discharge head, more particularly to an ink jet recording head which discharges ink to perform recording, and a method of manufacturing the ink jet recording head.

2. Related Background Art

As an ink jet recording head which discharges ink to perform recording, there is known a constitution ("side shooter type recording head") in which an ink droplet is discharged in a direction vertical to a substrate on which there is formed an ink discharge energy generating element such as a heat generating resistor.

The following method is known as a method of manufacturing such side shooter type recording head.

In U.S. Pat. No. 5,478,606, there is disclosed a method of manufacturing an ink jet recording head, including the following steps. First, an ink flow path pattern is formed of a soluble resin on the substrate on which the ink discharge energy generating element is formed. Subsequently, a coating resin containing a solid epoxy resin is dissolved in a solvent at ordinary temperature, and a soluble resin layer is coated with a solvent to thereby form the coating resin layer constituting an ink flow path wall on the soluble resin layer. Moreover, an ink discharge port is formed in the coating resin layer above an ink discharge pressure generating element to elute the soluble resin layer.

Moreover, in U.S. Pat. No. 5,331,344, there is disclosed a method of manufacturing an ink jet recording head, including the following steps. First, a first photosensitive material layer for forming an ink oath is disposed on the substrate on which the ink discharge energy generating element is formed to subject the first photosensitive material layer to pattern exposure for forming the ink path. Subsequently, a second photosensitive material layer is further disposed on the first photosensitive material layer to subject the second photosensitive material layer to exposure of a pattern for forming the ink discharge port and an ink supply port. Thereafter, the first and second photosensitive material layers are developed.

On the other hand, in U.S. Pat. No. 5,278,584, there is disclosed a method of manufacturing an ink jet recording head, in which an orifice plate member is laminated on a member integrated with the substrate provided with the ink discharge energy generating element and constituting an ink flow path wall. The orifice plate member is constituted of a flexible circuit substrate material, and a thermosetting adhesive or the like is used in laminating the orifice plate member on the ink flow path wall.

However, the above-described ink jet recording heads have the following problems, respectively.

That is, in the method disclosed in U.S. Pat. No. 5,478,606, since the substrate on which the ink flow path pattern is formed is coated with the solvent to form the coating resin layer constituting the ink flow path wall, the coating resin layer extends along the ink flow path pattern. Therefore, in the ink jet recording head manufactured by this method, fluctuations are generated in a thickness of an orifice plate to form thick and thin portions, and there might occur a problem in a reliability of the thin portion of the orifice plate depending on use conditions.

In the method disclosed in U.S. Pat. No. 5,331,344, the above-described fluctuations of the film thickness are not generated, but there is a possibility that a mutually dissolved layer of the respective materials is generated in a boundary surface between a latent image pattern upper layer portion of the first photosensitive material layer and the second photosensitive material layer. Since this mutually dissolved layer remains even after the development of the first and second photosensitive material layers, a discharge control itself of the ink jet recording head might be adversely influenced.

On the other hand, in the method disclosed in U.S. Pat. No. 5,278,584, the above-described problems due to the film thickness fluctuations and the mutually dissolved layer are not generated. However, since the orifice plate member provided with the ink discharge port is laminated on the member constituting the ink flow path wall, there is a possibility that a problem is generated in a precision in positioning the members. In a case where a deviation is generated, a discharge direction of the ink droplet deviates from a desired direction, and it accordingly becomes difficult to perform high-precision printing/recording. In recent years, it has been demanded that in the ink jet-recording head, a discharge amount be reduced in order to realize a picture quality, and an arrangement density of the discharge ports be increased, but it is difficult to satisfy such requirement by the method disclosed in U.S. Pat. No. 5,278,584.

SUMMARY OF THE INVENTION

The present invention has been developed in view of the above-described problems. An object of the present invention is to form an orifice plate to be flat while forming an ink discharge port in a substrate with a satisfactory positional precision, and to provide an ink jet recording head capable of performing printing and recording with a high precision and having a high reliability, and a method of manufacturing the ink jet recording head.

To achieve the above-described object, according to one aspect of the present invention, there is provided a method of manufacturing a liquid discharge head, comprising: a first photosensitive material layer forming step of forming a layer constituted of a first photosensitive material on a first substrate having a liquid discharge energy generating element which generates energy for discharging a liquid; a latent image forming step of performing pattern exposure on the first photosensitive material layer to form a latent image of a flow path pattern; a second substrate laminating step of laminating a flat second substrate constituted of an inorganic material on the photosensitive material layer on which the latent image has been formed; a discharge port forming step of forming a discharge port in the second substrate; and a flow path forming step of developing the pattern which has been formed in the latent image forming step and which is to constitute a flow path, and forming the flow path.

Moreover, according to another aspect of the present invention, there is provided a method of manufacturing a liquid discharge head, comprising: a mold forming step of forming, exposing, and developing a second photosensitive resin layer which is to constitute a mold of an ink flow path on a first substrate having a liquid discharge energy generating element which generates energy for discharging a liquid, and forming the mold which is to constitute a part of the ink flow path; a first photosensitive material layer forming step of forming a layer constituted of a first photosensitive material on the first substrate on which the mold of the ink flow path has been formed; a latent image forming step of performing pattern exposure on the first photosensitive material layer to form a latent image pattern which is to constitute a part of the flow path; a second substrate laminating step of laminating a flat second substrate constituted of an inorganic material on the photosensitive material layer on which the latent image has been formed; a discharge port forming step of forming a discharge port in the second substrate; and a flow path forming step of developing the latent image pattern which has been formed in the latent image forming step and which is to constitute a part of the flow path, and removing the pattern together with the mold formed in the mold forming step to form the flow path.

According to the above-described manufacturing method, the following effects can be produced.

1) Since the flat orifice plate constituted of the inorganic substrate is formed, a distance between the surface of the orifice plate and a heat generating resistor is kept to be constant, and ink droplet discharge properties of the ink jet recording head becomes very satisfactory.

2) The ink discharge port can be formed with a positioning precision by use of photolithography after laminating the orifice plate. Therefore, it is possible to provide the recording head whose ink discharge performance has been rapidly enhanced as compared with a method of forming the ink discharge port before laminating the plate.

3) Since the inorganic substrate made of silicon or the like is used in the orifice plate, a resin is not swollen owing to a ink liquid. The resin swelling is heretofore feared during use of the ink jet recording head. It is possible to provide the recording head having a high reliability even during long-term use.

4) The ink flow path made of the resin (photosensitive material) is formed between the substrate on which the heat generating resistor has been formed and the substrate which is to constitute the orifice plate. Therefore, the resin also functions as a bonding layer between the two substrates, and another adhesive layer for exclusive use is not required for a nozzle member. Therefore, there can be provided the manufacturing method which is capable of reducing manufacturing costs of the recording head.

5) Since the inorganic substrate is used in the orifice plate, it is not necessary to form any special ink-repellent layer that has been adopted in the conventional resin-made orifice plate.

6) Since the ink flow path is made of the resin, degrees of freedom in shape design and preparation are rapidly enhanced as compared with a case where the ink flow path is constituted of the inorganic substrate only. Therefore, the ink droplet discharge performance can be easily controlled.

DESCRIPTION OF THE PREFERRED EMBODIMENTS

Figure 1A:
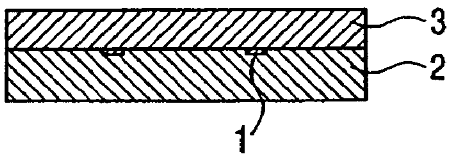
FIGS. 1A, 1B, 1C, 1D, 1E, 1F, 1G, and 1H are schematic sectional views showing a method of manufacturing an ink jet recording head according to Embodiment 1 of the present invention.

Embodiments of the present invention will be described hereinafter in detail with reference to the drawings.

It is to be noted that in the following description, portions having the same function are denoted with the same reference numerals, and description thereof is omitted. An ink jet recording head will be described hereinafter which jets ink to form a flying droplet and perform recording, but the present invention is not limited to a device which performs the recording. The present invention is applicable to a liquid discharge head which discharges a liquid, for use in, for example, preparing an electric wiring line, manufacturing a color filter, or preparing a DNA chip.

First Embodiment

Figure 3:
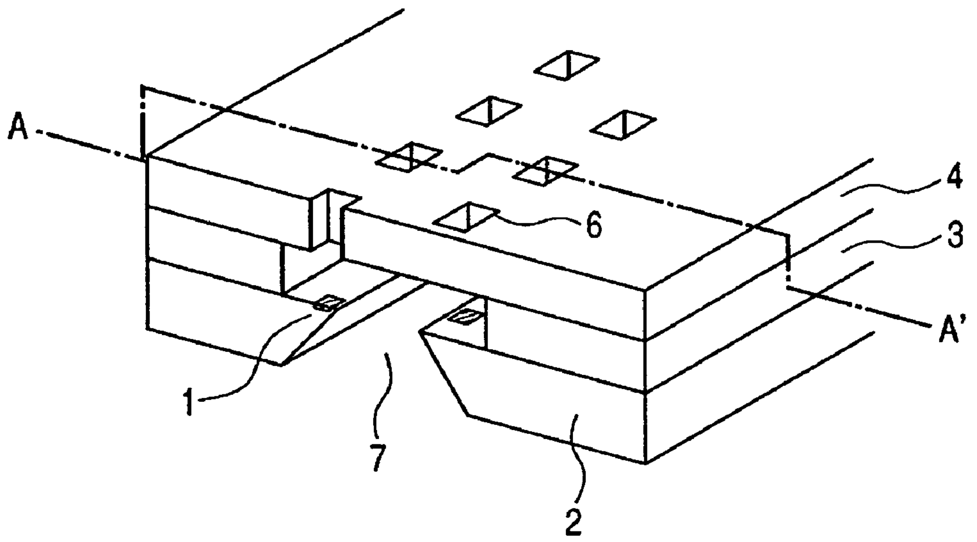
FIG. 3 is a schematic perspective view of an ink jet recording head to which a manufacturing method of the present invention is applied.

First, a method of manufacturing an ink jet recording head will be described according to the present invention with reference to FIGS. 1A to 1H. FIGS. 1A to 1H are schematic sectional views showing the method of manufacturing the ink jet recording head according to the present invention. It is to be noted that FIGS. 1A to 1H schematically show a section taken along A-A' of FIG. 3.

First, in the present embodiment, the desired number of ink discharge energy generating elements 1 such as heat generating resistors (electrothermal conversion elements) are arranged on a substrate 2 shown in FIG. 1A. Moreover, a photosensitive material layer 3 is formed on the substrate 2. The photosensitive material layer 3 is formed by, for example, laminating a dry film, or spin-coating the substrate with a resist.

Figure 1B:
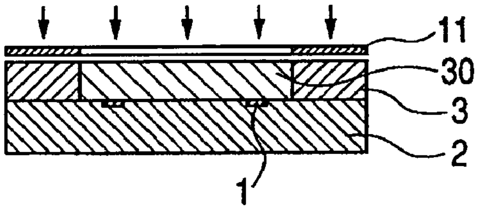

Next, as shown in FIG. 1B, a latent image pattern 30 which is to constitute an ink flow path is formed in the photosensitive material layer 3 by exposure to an ultraviolet ray, deep-UV light or the like by use of a photomask 11.

Figure 1C:
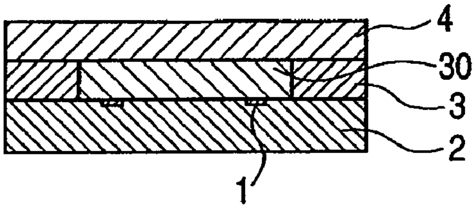

Here, a silicon substrate (thin silicon substrate 4) which is to constitute an orifice plate and which has been worked to be thin is laminated on the photosensitive material layer 3 (FIG. 1C). In this case, as the thin silicon substrate 4, there is used a silicon substrate which has been worked into a desired thickness by mechanical or chemical grinding or polishing such as back-grinding, CMP, or spin-etching. It is to be noted that the substrate which is to constitute the orifice plate is not limited to the silicon substrate, and a substrate made of an inorganic material (inorganic substrate) may be used.

Figure 1D:
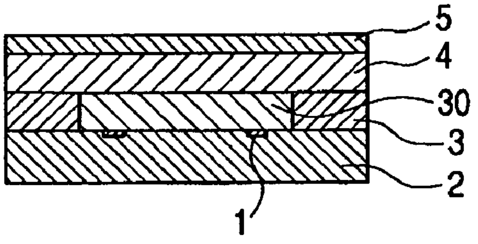
Figure 1E:
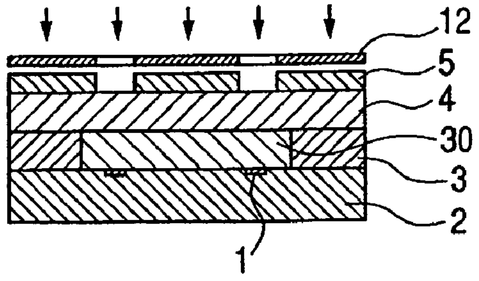

Next, ink discharge ports 6 are formed in portions of the thin silicon substrate 4 which are positioned vertically above the ink discharge energy generating elements 1. First, as shown in FIG. 1D, a photo resist layer 5 which is a photosensitive material layer is formed on the thin silicon substrate 4. Next, as shown in FIG. 1E, patterns corresponding to the ink discharge ports 6 are formed by steps of exposure to the ultraviolet ray or the like, development and the like by use of a photo mask 12. In this exposure step, there are utilized positioning alignment marks prepared on the substrate 2 in order to position the ink discharge ports. There is a positioning method in which an exposure unit is used that adopts an alignment system by means of an infrared ray, or through holes (denoted with 23 in FIG. 4B) are disposed beforehand in the thin silicon substrate 4 with respect to regions which are larger than portions corresponding to the alignment marks on the substrate 2. Alternatively, a substrate provided with a cut pattern 24 shown in FIG. 4C may be used as the thin silicon substrate 4, so that the alignment marks can be observed. When the alignment marks are disposed in the vicinity of an outer periphery of the substrate 2, and the thin silicon substrate 4 that is smaller than the substrate 2 is prepared, the alignment marks on the substrate 2 can be observed. It is to be noted that a through port for alignment, or such a shape that the alignment mark can be observed may be worked, before laminating the thin silicon substrate 4. Alternatively, it may be worked using means similar to that for forming the ink discharge ports 6 after the laminating.

Figure 1F:
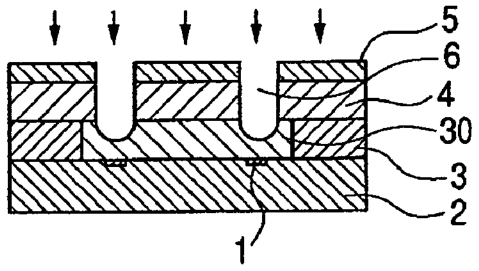

Moreover, as shown in FIG. 1F, the ink discharge ports 6 are formed in the thin silicon substrate 4 by dry etching. An RIE device such as ECR or ICP may be used in the dry etching.

Figure 1G:
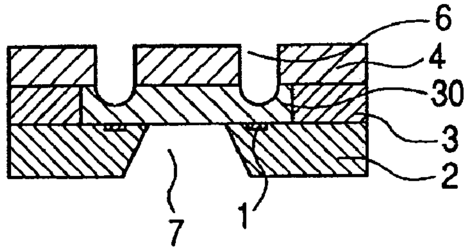

Thereafter, as shown in FIG. 1G, the photo resist 5 is peeled, and an ink supply port 7 is formed. As means for forming the ink supply port 7, mechanical working by sand blasting or the like, chemical working by crystal anisotropic etching or the like may be performed in a case where, for example, silicon is used as the substrate 2.

Figure 1H:
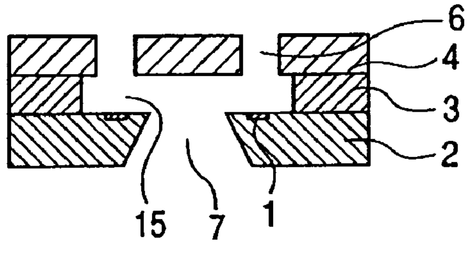
Figure 2A:
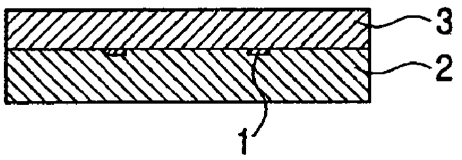
FIGS. 2A, 2B, 2C, 2D, 2E, 2F, 2G, and 2H are schematic sectional views showing a method of manufacturing an ink jet recording head according to Embodiment 2 of the present invention.
Figure 2B:
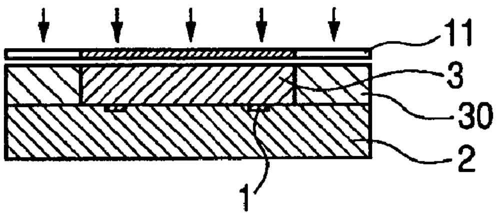
Figure 2C:
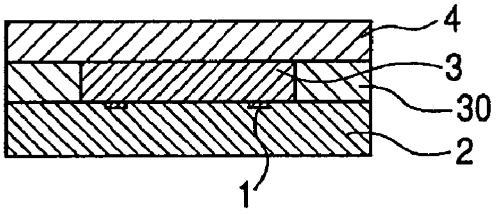
Figure 2D:
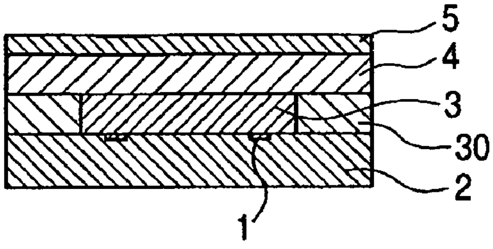
Figure 2E:
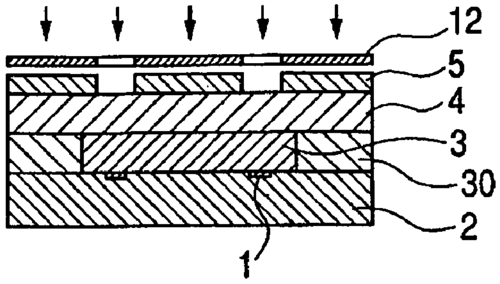
Figure 2F:
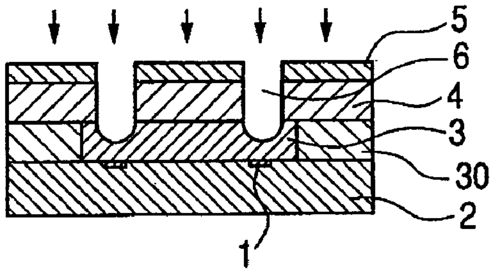
Figure 2G:
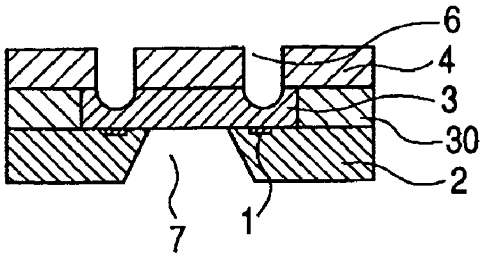
Figure 2H:
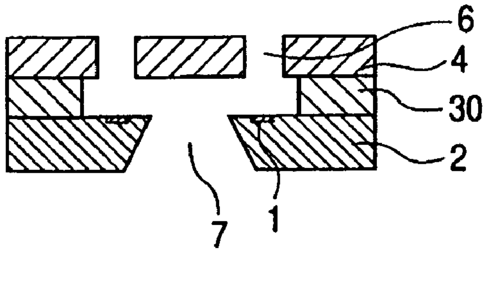

Furthermore, the latent image pattern 30 formed in the step 5 shown in FIG. 1B is developed and eluted to thereby form an ink flow path 15 (FIG. 1H).

The substrate 2 on which a nozzle portion has been prepared by the above-described steps is separated and cut into chips with a dicing saw or the like. Moreover, after performing electric bonding (not shown) for driving the ink discharge energy generating elements 1, a chip tank member for ink supply is connected, and the ink jet recording head is completed.

According to the above-described steps, since the ink discharge ports are formed after laminating the substrate which is to constitute the orifice plate, the ink discharge ports can be formed using an aligner or the like with a high positional precision.

Moreover, since silicon is used in the substrate that is to constitute the orifice plate, the substrate is not influenced by swelling by ink, peeling or the like, and the substrate is also provided with a liquid-repellent performance of the surface of the orifice plate which largely influences the ink discharge.

Second Embodiment

Next, a method of manufacturing another liquid discharge head of the present invention will be described with reference to FIGS. 5A to 5L. FIGS. 5A to 5L are schematic sectional views showing the method of manufacturing the ink jet recording head according to the present invention. First, in the present embodiment, the desired number of ink discharge energy generating elements 1 are arranged on a substrate 2 shown in FIG. 5A. Moreover, a photosensitive material layer 41 is formed on the substrate 2.

Figure 5A:
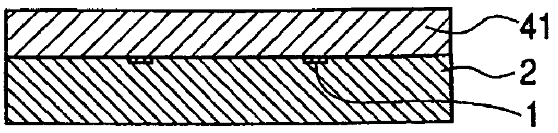
FIGS. 5A, 5B, 5C, 5D, 5E, 5F, 5G, 5H, 5I, 5J, 5K, and 5L are schematic sectional views showing a method of manufacturing an ink jet recording head according to Embodiment 3 of the present invention.
Figure 5B:
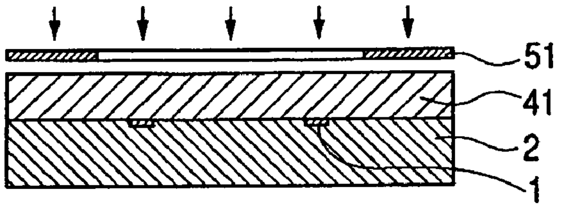
Figure 5C:
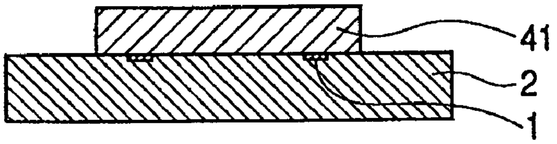
Figure 5D:
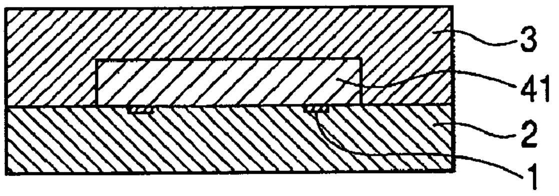
Figure 5E:
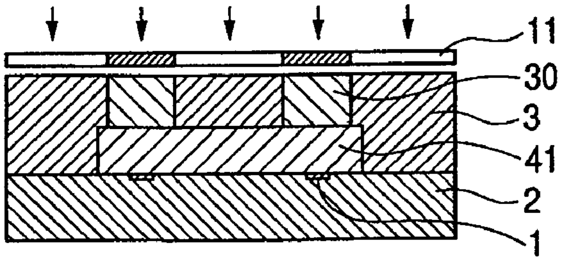

Next, as shown in FIG. 5E, a latent image 30 of a pattern which is to constitute an ink flow path is formed in the photosensitive material layer 3 by exposure to an ultraviolet ray, deep-UV light or the like via a photo mask 11.

Figure 5F:
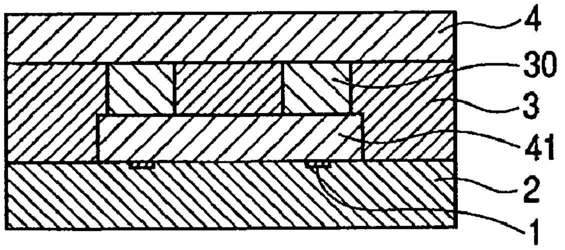

Here, a silicon substrate 4 which is to constitute an orifice plate and which has been worked to be thin is laminated on the photosensitive material layer 3 (FIG. 5F).

Figure 5G:
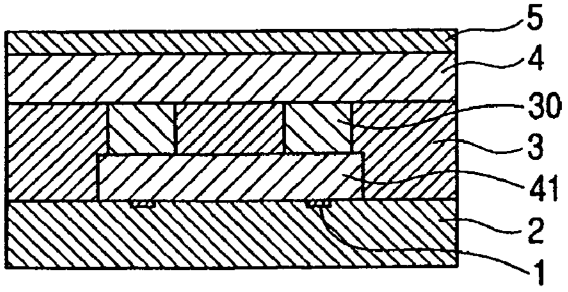

Next, ink discharge ports 6 are formed in portions of the thin silicon substrate 4 which are disposed vertically above the ink discharge energy generating elements 1. To form the ink discharge ports 6, first, as shown in FIG. 5G, a photosensitive material layer 5 is formed on the thin silicon substrate 4.

Figure 5H:
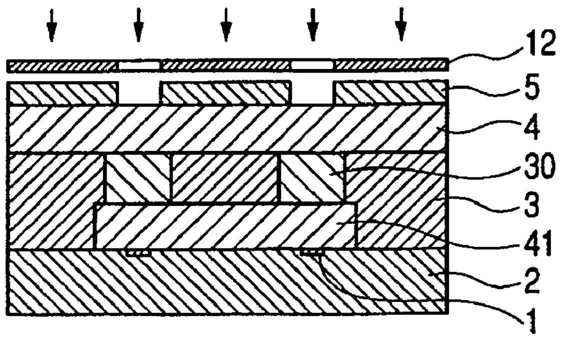

Next, as shown in FIG. 5H, patterns corresponding to the ink discharge ports 6 are formed by steps of exposure to the ultraviolet ray or the like, development and the like by use of a photo mask 12. In this exposure step, there are utilized positioning alignment marks prepared on the substrate 2.

Figure 5I:
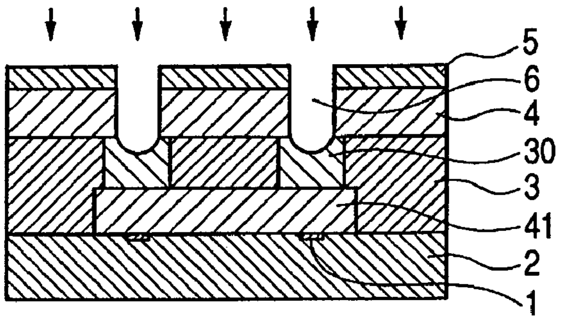
Figure 5J:
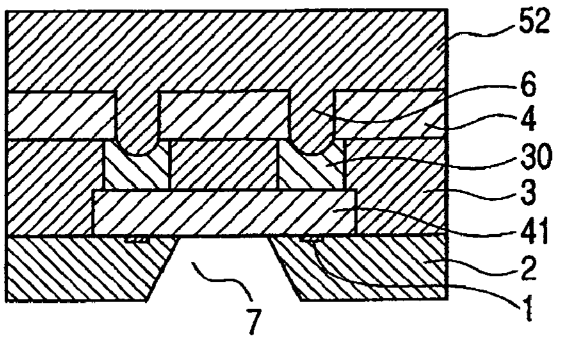
Figure 5K:
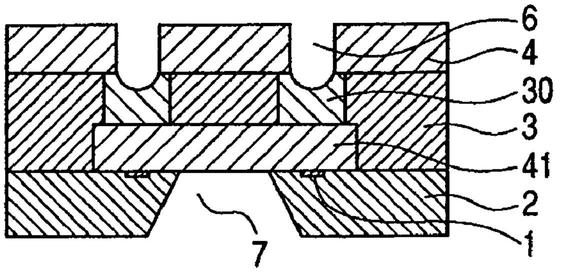

Moreover, as shown in FIG. 5I, the ink discharge ports 6 are formed in the thin silicon substrate 4 by dry etching. Thereafter, as shown in FIG. 5J, the photosensitive material layer 5 is peeled, and an ink supply port 7 is formed. Here, in a case where a protective film layer 52 is formed on the surface in which the ink discharge ports 6 are formed, the photosensitive material layer 5 may be peeled before the step of forming the ink supply port 7, or may be peeled simultaneously with the peeling of the protective film layer 52 after the ink supply port 7 is formed (FIG. 5K).

Figure 5L:
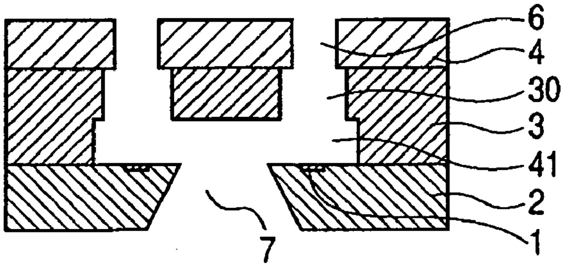

Furthermore, the latent image pattern 30 formed in the step shown in FIG. 5E, and the ink flow path pattern 41 formed in the step shown in FIG. 5C are developed and eluted to thereby form the, ink flow path (FIG. 5L). Moreover, the substrate 2 on which a nozzle portion has been prepared by the above-described steps is separated and cut into chips with a dicing saw or the like. Furthermore, after performing electric bonding (not shown) for driving the ink discharge energy generating elements 1, a chip tank member for ink supply is connected, and the ink jet recording head is completed.

According to the above-described steps, an effect similar to that of the first embodiment is obtained. In addition, since the ink flow path can be formed into a three-dimensional structure, there can be provided the recording head whose ink droplet discharge efficiency has been enhanced as compared with an ink jet recording head having a conventional constitution.

EXAMPLES

The present invention will be more specifically described hereinafter in accordance with two examples of each embodiment.

Example 1

In Example 1, an ink jet recording head was prepared in accordance with the above-described procedure shown in FIGS. 1A to 1H. Here, heat generating resistors made of tantalum nitride were used as ink discharge energy generating elements 1, and a silicon substrate was used as a substrate 2.

Moreover, a radical polymerized material of methacrylate anhydride was used in a photosensitive material layer 3 in FIG. 1B, and the substrate was coated with a solvent to form the layer having a thickness of 20 μm. Next, the layer was irradiated with deep-UV light of an aligner "model No. UX-3000" manufactured by Ushio Inc. at a ratio of 40000 $mJ/cm^2$ by use of a photo mask 11, and a latent image pattern 30 which was to constitute an ink flow path was formed (FIG. 1C).

Next, as shown in FIG. 1D, a thin silicon substrate 4 worked to be thin was laminated on the photosensitive material layer 3. After this thin silicon substrate 4 was worked to be as thin as about 100 μm with a back grinding device, a crushed layer was removed by chemical etching, and the substrate was worked into a thickness of 50 μm. In this case, the film thickness of the thin silicon substrate 4 was within a range of 3 μm.

Figure 4A:
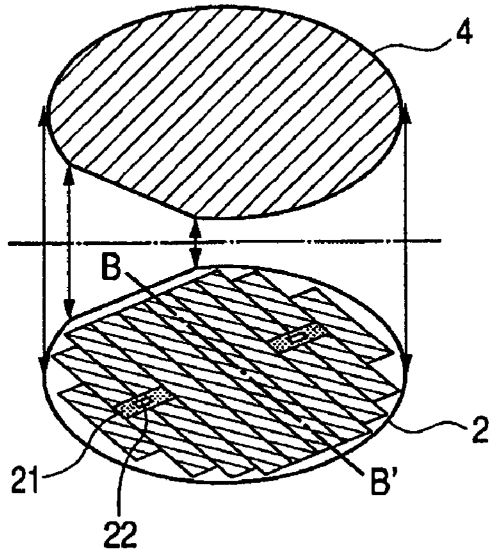
FIGS. 4A, 4B, and 4C are explanatory views showing alignment of ink discharge ports in forming the ports in the manufacturing method of the present invention.

Subsequently, alignment required for forming ink discharge ports 6 in the thin silicon substrate 4 was performed with respect to the silicon substrate 2. To be more specific, as shown in FIGS. 4A, B, through ports (alignment mark observing windows) 23 through which alignment marks 21 formed in the silicon substrate 2 can be observed are disposed in the thin silicon substrate 4.

Figure 4B:
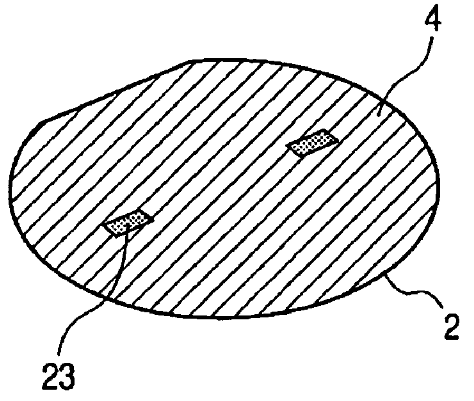
Figure 4C:
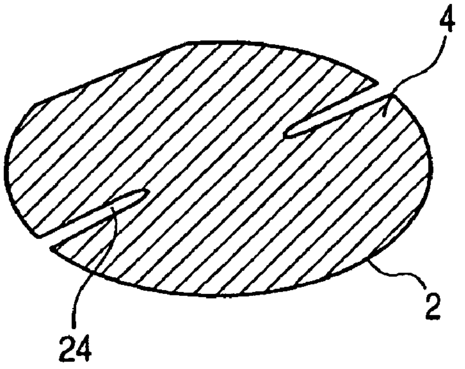

A method of forming the through ports 23 conforms to that of forming the ink discharge ports 6 described later. That is, a photo resist 5 (OFPR-800 manufactured by Tokyo Ohka Kogyo Co., Ltd.) was formed into a thickness of 1 μm on the thin silicon substrate 4. Moreover, patterns of the through ports 23 which were to constitute the windows for observing the alignment marks were formed at a ratio of 100 mJ/cm$^2$ with an exposure device “model number MPA-600 Super” manufactured by Cannon Inc. in an exposing and developing step. This through port pattern may be sufficiently formed into a pattern which opens to be smaller than the region 21 provided with an alignment mark 22 on the substrate 2 and broader than the alignment mark 22 of the substrate 2 with a mechanical pre-alignment precision of the aligner. Furthermore, silicon was dry-etched by use of “Alcatel Micro Machining System 200” which was an ICP dry etcher manufactured by Alcatel Inc., and the through ports 23 which were to constitute the windows for observing the alignment marks were formed as shown in FIG. 4B.

Moreover, as shown in FIG. 1E, after the photo resist 5 was formed, the resist was exposed and developed with the exposure device “model number MPA-600 Super” manufactured by Cannon Inc. by use of a photo mask 12. Accordingly, patterns corresponding to the ink discharge ports 6 were formed in portions of the thin silicon substrate 4 disposed vertically above the heat generating resistors 1.

Here, as shown in FIG. 1F, silicon was dry-etched by use of the “Alcatel Micro Machining System 200” to form the ink discharge ports 6. When silicon is dry-etched, a substantially vertical sectional shape can be obtained by a process of repeating etching and depositing. In this case, even when portions of the photosensitive resin layer 3 under the ink discharge ports 6 are influenced by dry over etching, there is not any problem because the portions are eluted in the subsequent step.

Furthermore, after peeling the photo resist 5 as an etching-resistant mask, and forming an alkali-resistant protective member (not shown) on the thin silicon substrate 4, as shown in FIG. 1G, an ink supply port 7 was formed by crystal anisotropic etching using an alkali solution.

Subsequently, when the latent image pattern 30 of the photosensitive material layer 3 was developed and eluted with methyl isobutyl ketone, an ink flow path 15 was formed as shown in FIG. 1H.

Moreover, the photosensitive material layer 3 was heat-cured in an oven at 250° C. for 60 minutes, and the substrate provided with a nozzle member was completed.

Finally, the substrate 2 on which the nozzle portion was prepared by the above-described steps was separated and cut into chips with a dicing saw or the like, and electrically bonded (not shown) in order to drive the ink discharge energy generating elements 1. Thereafter, a chip tank member for ink supply was connected, and the ink jet recording head was completed.

As a result of printing and recording with ink droplets discharged from the ink jet recording head prepared in Example 1, very high quality printing was achieved.

Furthermore, as a result of the printing and recording at 7.5% duty per A4-size sheet in the recording head of Example 1, even when the number of the printed sheets exceeded 8000 sheets, discharge properties were not deteriorated, and satisfactory printing and recording were achieved.

Example 2

In Example 2, an ink jet recording head was prepared in accordance with a procedure shown in FIGS. 2A to 2H. In FIGS. 2A to 2H, a negative resist constituted of a composition shown below in Table 1 was used as a photosensitive material layer 3.

TABLE 1

| | | |
|---|---|---|
| Epoxy resin | Oxycyclohexane skeleton multifunctional epoxy resin (EHPE-3150 manufactured by Daicel Chemical Industries, LTD.) | 100 parts |
| Photo cationic polymerization initiator | 4,4'-di-t-butylphenyl iodonium hexafluoroantimonate | 0.5 part |
| Reducing agent | Copper triflate | 0.5 part |
| Silane coupling agent | A-187 manufactured by Nihon Unicar Co. | 5 parts |

Moreover, in a final step, the layer was heat-cured in an oven at 200° C. for 60 minutes.

As a result of printing and recording performed with ink droplets discharged from the ink jet recording head prepared in Example 2, very high quality printing was achieved.

Furthermore, as a result of the printing and recording performed at 7.5% duty per A4-size sheet in, the recording head of Example 2, even when the number of the printed sheets exceeded 8000 sheets, discharge properties were not deteriorated, and satisfactory printing and recording were achieved.

Example 3

In Example 3, an ink jet recording head was prepared in accordance with a procedure shown in FIGS. 5A to 5L. Here, heat generating resistors made of tantalum nitride were used as ink discharge energy generating elements 1, and a silicon substrate was used as a substrate 2.

Moreover, in FIG. 5B, the substrate was spin-coated with a photosensitive material layer 41 having a thickness of 10 μm by use of ODUR-1010 manufactured by Tokyo Ohka Kogyo Co., Ltd. Next, the layer was irradiated with deep-UV light of an aligner UX-3000 manufactured by Ushio Inc. at a ratio of 150000 mJ/cm$^2$ by use of a photo mask 51, and an ink flow path pattern 41 was formed by performing development with methyl isobutyl ketone (FIG. 5C).

Subsequently, the ink flow path pattern 41 was solvent-coated with a photosensitive material layer 3 constituted of a composition of Table 2 (FIG. 5D).

TABLE 2

| | |
|---|---|
| EHPE (manufactured by Daicel Chemical Industries, LTD. | 100 parts by weight |
| 1.4 HFAB (manufactured by Central Glass Co., Ltd.) | 20 parts by weight |
| SP-170 (manufactured by Asahi Denka Kogyo K. K.) | 2 parts by weight |
| A-187 (manufactured by Nihon Unicar Co.) | 5 parts by weight |
| Methyl isobutyl ketone | 100 parts by weight |
| Diglyme | 100 parts by weight |

In this case, the film was formed into a thickness of 5 μm on the ink flow path pattern 41, so that a total film thickness was 15 μm. Moreover, as shown in FIG. 5E, the film was exposed to light with MPA-600 Super manufactured by Cannon Inc. at a ratio of 1000 mJ/cm$^2$ by use of a photo mask 11, and post exposure baking (PEB) was performed at 90° C. to thereby form a latent image pattern 30 which was to constitute a part of an ink flow path.

Next, as shown in FIG. 5F, a silicon substrate 4 was laminated on a photosensitive material layer 3. After the silicon substrate 4 was worked to be as thin as about 50 μm with a back grinding device, the substrate was thinned by chemical-etching to remove a crushed layer, and the substrate was worked into a thickness of 10 μm.

Subsequently, in order to perform alignment required for forming ink discharge ports 6 in the thin silicon substrate 4 with respect to the silicon substrate 2, as shown in FIG. 4A, through ports (alignment mark observing windows) 23 through which alignment marks 21 formed on the silicon substrate 2 could be observed were disposed in the thin silicon substrate 4. A method of forming the through ports 23 conforms to that of forming the ink discharge ports 6 described later. That is, a photosensitive material layer 5 (OFPR-800 manufactured by Tokyo Ohka Kogyo Co., Ltd.).was formed into a thickness of 1 μm on the thin silicon substrate 4, and patterns of the through ports 23 which were to constitute the windows for observing the alignment marks were formed at a ratio of 100 mJ/cm$^2$ with MPA-600 Super manufactured by Cannon Inc. in an exposing and developing step. This through-port pattern maybe sufficiently formed into a pattern which opens to be smaller than the region 21 provided with the alignment mark on the substrate 2 and broader than the alignment mark 22 of the substrate 2 with a mechanical pre-alignment precision of the aligner. Furthermore, silicon was dry-etched by use of Alcatel Micro Machining System 200 which was an ICP dry etcher manufactured by Alcatel Inc., and the alignment mark observing windows 23 were formed as shown in FIG. 4B.

Moreover, as shown in FIG. 5G, after forming the photosensitive material layer 5, the layer was exposed and developed with MPA-600 Super by use of a photo mask 12, and patterns corresponding to the ink discharge ports 6 were formed in portions disposed vertically above the heat generating resistors 1 (FIG. 5H)

Here, the ink discharge ports 6 were formed by dry-etching silicon by use of Alcatel Micro Machining System 200 as shown in FIG. 5I. In this case, even when portions of the photosensitive resin layer 3 under the ink discharge ports 6 are influenced by dry over etching, there is not any problem because the portions are eluted in the subsequent step.

Furthermore, after peeling the photosensitive material layer 5 as an etching-resistant mask, and forming an alkali-resistant protective member 52 on the thin silicon substrate 4, as shown in FIG. 5J, an ink supply port 7 was formed by crystal anisotropic etching using an alkali solution.

After peeling the alkali-resistant protective member 52. (FIG. 5K), the latent image portion 30 of the photosensitive material layer 3 was developed and eluted with methyl isobutyl ketone. Furthermore, after the layer was irradiated with deep-UV light of CE-6000 manufactured by Ushio Inc. at a ratio of 30000 mJ/cm$^2$, the layer was developed and eluted with methyl isobutyl ketone to form an ink flow path as shown in FIG. 5L.

Finally, the layer was heat-cured in an oven at 200° C. for 60 minutes, and the substrate provided with a nozzle member was completed. Furthermore, the substrate 2 on which the nozzle portion was prepared by the above-described steps was separated and cut into chips with a dicing saw or the like, and electrically bonded (not shown) in order to drive the heat generating resistors 1. Thereafter, a chip tank member for ink supply was connected, and the ink jet recording head was completed.

As a result of printing and recording performed with ink droplets discharged from the ink jet recording head prepared in Example 3, very high quality printing was achieved.

Furthermore, as a result of the printing and recording performed at 7.5% duty per A4-size sheet in the recording head of Example 3, even when the number of the printed sheets exceeded 8000 sheets, discharge properties were not deteriorated, and satisfactory printing and recording were achieved.

Example 4

Figure 6A:
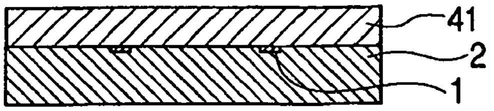
FIGS. 6A, 6B, 6C, 6D, 6E, 6F, 6G, 6H, 6I, 6J, 6K, 6L, 6M, 6N, and 6O are schematic sectional views showing a method of manufacturing an ink jet recording head according to Embodiment 4 of the present invention.
Figure 6B:
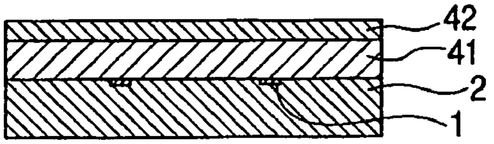
Figure 6C:
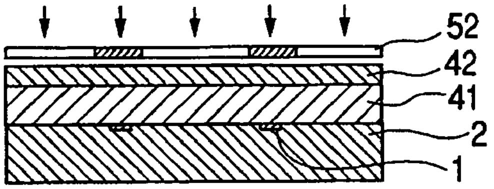
Figure 6D:
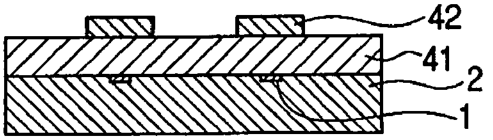
Figure 6E:
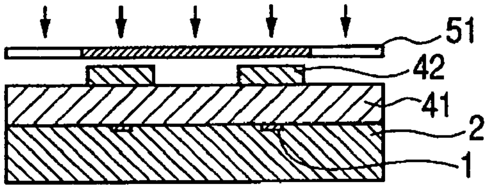
Figure 6F:
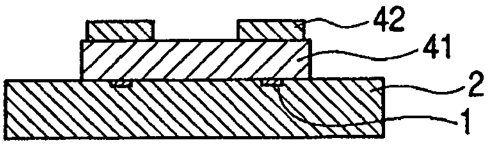
Figure 6G:
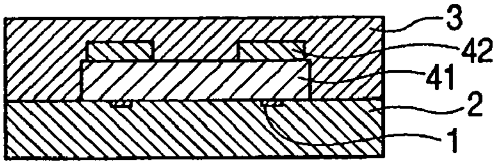
Figure 6H:
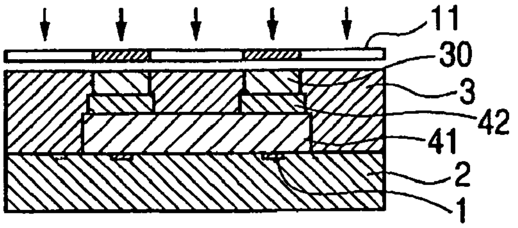
Figure 6I:
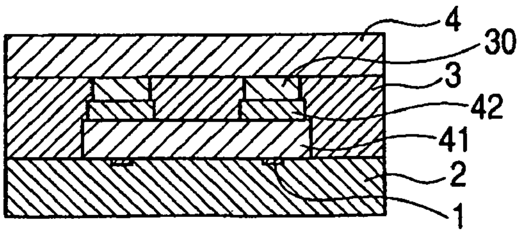
Figure 6J:
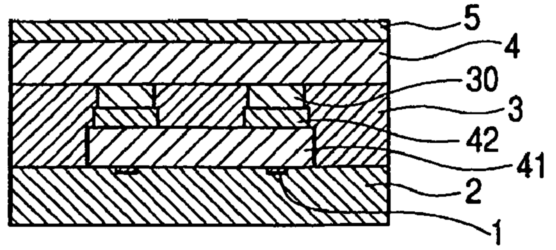
Figure 6K:
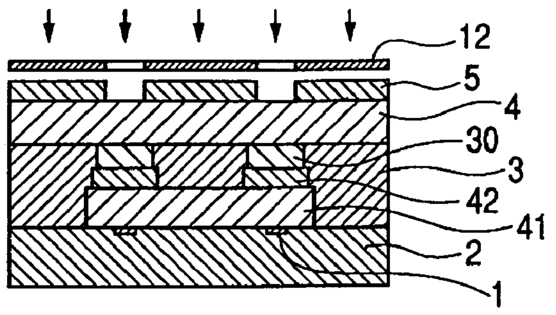
Figure 6L:
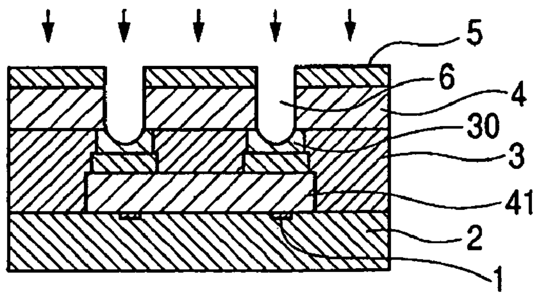
Figure 6M:
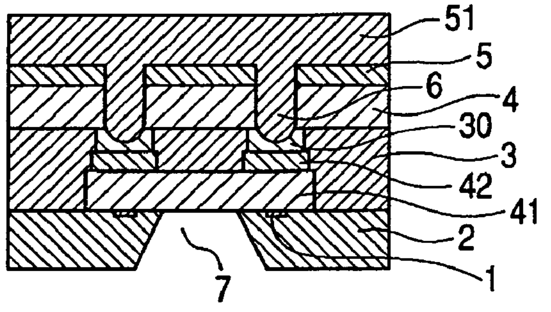
Figure 6N:
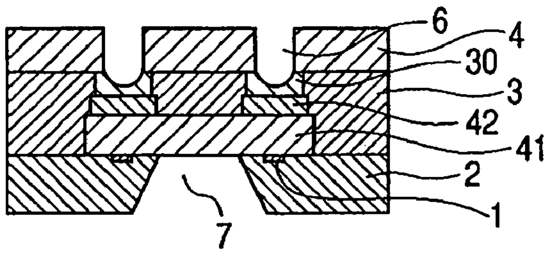
Figure 6O:
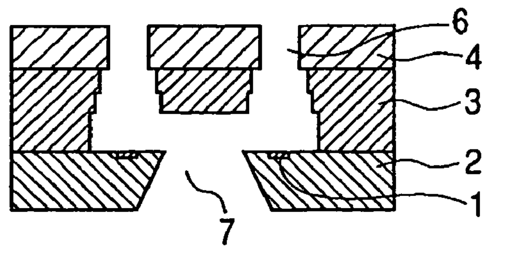

In Example 4, an ink jet recording head was prepared in accordance with a procedure shown in FIGS. 6A to 6O.

First, in FIG. 6A, a substrate was spin-coated with a photosensitive material layer 41 having a film thickness of 7 μm by use of ODUR-1010 manufactured by Tokyo Ohka Kogyo Co., Ltd.

Subsequently, in FIG. 6B, a radical polymerized material of methacrylate anhydride was dissolved in a diethylene glycol methyl ether solvent, and the layer was spin-coated with this material having a thickness of 3 μm as a photosensitive material layer 42. Next, the layer was irradiated with deep-UV light of an aligner UX-3000 manufactured by Ushio Inc., in which an optical filter for cutting light having a wavelength of 260 nm or more was used, at a ratio of 4000 mJ/cm$^2$ by use of a photo mask 52 (FIG. 6C). Subsequently, an image was developed with a developing solution constituted of the following composition to thereby form a pattern 42 which was to constitute a part of an ink flow path (FIG. 6D):

Diethylene glycol monobutyl ether 60 vol %;

Ethanol amine 5 vol %;

Morpholine 20 vol %;. and

Ion exchange water 15 vol %.

Furthermore, as shown in FIG. 6E, the layer was irradiated with deep-UV light of UX-3000 using the optical filter for cutting light having a wavelength of 260 nm or less at a ratio of 20000 mJ/cm$^2$ by use of a photo mask 51. Subsequently, an image was developed with methyl isobutyl ketone to form the ink flow path pattern 41 (FIG. 6F).

Thereafter, a photosensitive material layer 3 (constituted of the same composition as that of the photosensitive material layer 3 described in Example 1) was formed (FIG. 6G), a latent image pattern 30 was formed by exposure (FIG. 6H), and ink discharge ports 6 were formed in a thin silicon substrate 4 (FIGS. 6J to 6L). Moreover, an ink supply port 7 was formed (FIG. 6M), and the latent image pattern 30 and the photosensitive material layers 41, 42 were similarly eluted (FIGS. 6N to 6O to thereby complete an ink flow path pattern.

Moreover, finally, the ink jet recording head of Example 4 was completed by performing heat-curing in an oven at 200° C. for 60 minutes, chip cutting, electric-bonding and the like.

As a result of printing and recording performed with ink droplets discharged from the ink jet recording head prepared in Example 4, very high quality printing was achieved.

Furthermore, as a result of the printing and recording performed at 7.5% duty per A4-size sheet in the recording head of Example 4, even when the number of the printed sheets exceeded 8000 sheets, discharge properties were not deteriorated, and satisfactory printing and recording were achieved.

This application claims priority from Japanese Patent Application No. 2004-337301 filed on Nov. 22, 2004, which is hereby incorporated by reference herein.

What is claimed is:

1. A method of manufacturing a liquid discharge head including a discharge port to discharge liquid and a flow path forming member, for forming a flow path communicated with the discharge port, said method comprising, in order, the steps of:

(a) forming a photosensitive material layer for forming the flow path forming member on a first substrate having a liquid discharge energy generating element which generates energy for discharging the liquid from the discharge port;

(b) performing pattern exposure on the photosensitive material layer to form a latent image portion of a flow path pattern in the photosensitive material layer;

(c) laminating a second substrate which is substantially parallel to the photosensitive material layer constituted of an inorganic material on the photosensitive material layer in which the latent image has been formed;

(d) forming the discharge port in the second substrate; and (e) removing the latent image portion from the photosensitive material layer to form the flow path.

2. The method of manufacturing the liquid discharge head according to claim 1, wherein forming the discharge port in the second substrate in step (d) comprises the steps of:

(d1) forming a second photosensitive material layer on the second substrate;

(d2) exposing and developing the second photosensitive material layer to form a discharge port pattern; and (d3) etching the second substrate by use of the discharge port pattern.

3. The method of manufacturing the liquid discharge head according to claim 1, wherein a positioning mark is formed in the first substrate, and a position where the discharge port is to be formed is adjusted by use of the positioning mark during step (d).

4. The method of manufacturing the liquid discharge head according to claim 3, wherein the second substrate is smaller than the first substrate, and the positioning mark is exposed even after step (c).

5. The method of manufacturing the liquid discharge head according to claim 3, wherein after step (c), through holes are formed in the second substrate or the second substrate is cut to thereby expose the positioning mark.

6. The method of manufacturing the liquid discharge head according to claim 3, wherein the positioning mark is detected via the second substrate by use of an infrared ray.

7. A method of manufacturing a liquid discharge head including a discharge port to discharge liquid and a flow path forming member, for forming a flow path communicated with the discharge port, said method comprising, in order the steps of:

(a) providing a mold of a portion of the flow path on a first substrate having a liquid discharge energy generating element which generates energy for discharging the liquid from the discharge port;

(b) providing a photosensitive material layer for forming a flow path forming member on the first substrate, so as to cover the mold;

(c) performing pattern exposure on the photosensitive material layer to form a latent image pattern portion which is to constitute a part of the flow path in the photosensitive material layer;

(d) laminating a second substrate which is substantially parallel to the photosensitive material layer constituted of an inorganic material on the photosensitive material layer in which the latent image has been formed;

(e) forming the discharge port in the second substrate; and (f) removing the latent image from the photosensitive material layer and the mold to form the flow path.

8. The method of manufacturing the liquid discharge head according to claim 1, wherein in the forming the discharge port in the second substrate, the second substrate is processed by dry etching and a location where the discharge port is provided is a portion corresponding to a region of the latent image.

* * * * *